United States Patent [19]

Katanosaka

[11] Patent Number: 4,741,003
[45] Date of Patent: Apr. 26, 1988

[54] SHIFT REGISTER CIRCUIT
[75] Inventor: Naoki Katanosaka, Tokyo, Japan
[73] Assignee: NEC Corporation, Tokyo, Japan
[21] Appl. No.: 886,298
[22] Filed: Jul. 16, 1986
[30] Foreign Application Priority Data
  Jul. 16, 1985 [JP] Japan .................... 60-157415
[51] Int. Cl.$^4$ .................... G11C 11/40; G11C 19/28
[52] U.S. Cl. .................... 377/79; 377/105; 307/481
[58] Field of Search .................. 377/79, 105; 307/481, 307/353, 453

[56]  References Cited
  U.S. PATENT DOCUMENTS
  3,794,856  2/1974  Baker .................... 377/81
  4,295,055 10/1981  Takemoto et al. ......... 377/79

Primary Examiner—John S. Heyman
Attorney, Agent, or Firm—Sughrue, Mion, Zinn, Macpeak, and Seas

[57]  ABSTRACT

A shift register circuit, including a plurality of stages capable of preserving data bits entered from an external source and shifting the data bits from stage to stage, each of the stages being driven by phase one, phase two and phase three clock signals, each signal alternating between a first and a second logic level. The shift register circuit comprises a first transistor responsive to the phase one clock signal for transferring a new data bit of either first or second logic level, a series combination of second, third, fourth and fifth transistors, and an output node provided between the third and fourth transistors. The second and third transistors are responsive to the new data bit transferred through the first transistor and the phase two clock signal, respectively, to place the phase three clock signal with the logic level corresponding to that of the new data bit at the output node. The fourth and fifth transistors are responsive to a previous data bit transferred to the subsequent stage and the phase three clock signal, respectively, for canceling the logic level of the previous data bit at the output node. This circuit structure results in a reduction in power dissipation.

6 Claims, 5 Drawing Sheets

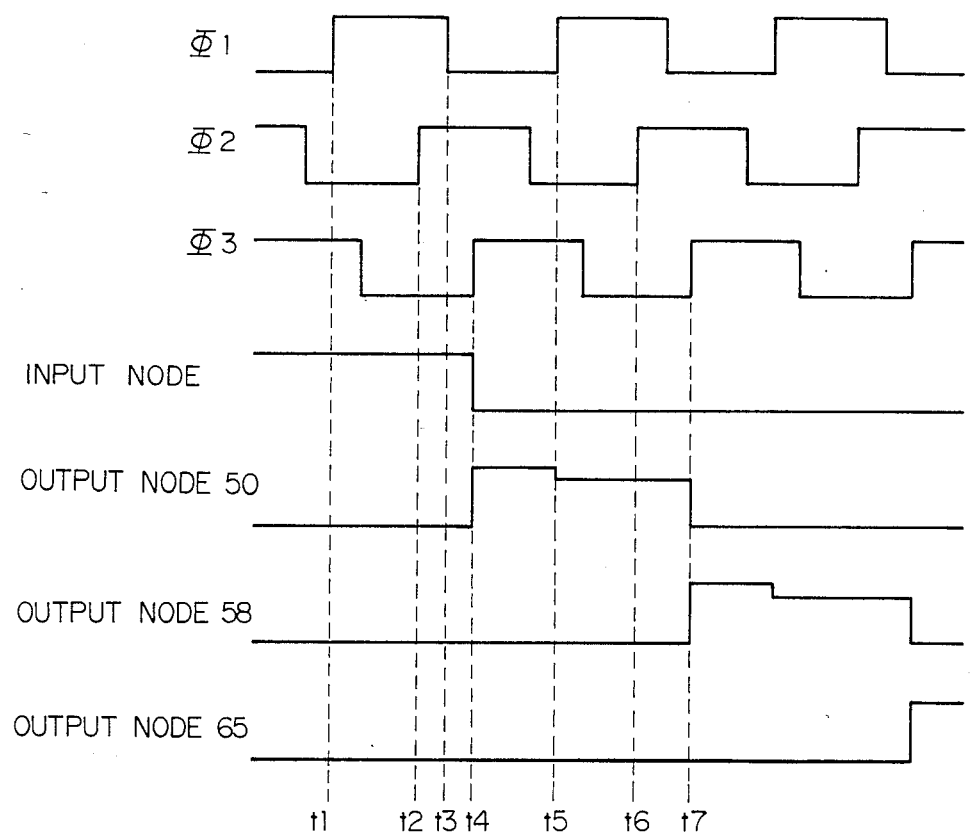

SHIFT REGISTER CIRCUIT

FIELD OF THE INVENTION

The present invention relates to a shift register circuit and, more particularly, to a shift register circuit of the type clocked by a set of pulse signals.

BACKGROUND OF THE INVENTION

A part of a typical example of a known shift register circuit is illustrated in FIGS. 1 to 3. The known shift register circuit basically comprises a plurality of stages, however FIG. 1 shows first and second stages 1 and 2, only. The first stage 1 consists of two inverter circuits 3 and 4 and two transfer gates 5 and 6 which are alternately arranged and connected in series to store a data bit D1 appearing at an input node 7 in response to a phase one ($\Phi$1) clock and transfer a data bit D2 preserved therein during the previous cycle to the second stage 2 when a phase two ($\Phi$2) clock goes up to a high level. The second stage 2 thus fetching the data bit D2 also consists of a combination of a transfer gate 8 and an inverter circuit 9 for storing the data bit D2 and a combination of a transfer gate 10 and an inverter circuit 11 for transferring a data bit D3 also stored therein during the previous cycle.

Each of the stages is arranged as shown in FIG. 2 and is constituted by six n-channel field effect transistors 12 to 17. The transistors 12 and 15 are clocked by the phase one ($\Phi$1) clock and the phase two ($\Phi$2) clock, respectively, and respectively correspond to the transfer gate 5 or 8 and the transfer gate 6 or 10 in FIG. 1. 18 and 19 indicate the respective gate capacitance of the field effect transistors 14 and 17, respectively. The shift register circuit illustrated in FIG. 1 can therefore is rewritten as illustrated in FIG. 3 in which the reference numerals used in FIG. 2 designate corresponding transistors and gate capacitances incorporated in the first stage 1 of the shift register circuit. On the other hand, reference numerals 22 to 29 designate transistors or gate capacitances of the second stage 2 corresponding to the components indicated by reference numerals 12 to 19 in FIG. 2, respectively.

Functions of the respective transistors incorporated in the conventional shift register circuit is described hereinunder on the assumption that the data bits D2 and D3 of the low level are stored in the first and second stages, respectively, and that the data bit D1 of the high level appears at the input node 7. Upon completion of the previous shift cycle, the gate capacitances 19 and 29 have been charged and caused the transistors 17 and 27 to turn on to establish current paths from output nodes 31 and 32 to the ground, respectively, then allowing the output nodes 31 and 32 to be in low levels. After the data bit of high level appears at the input node 7, the transistor 12 serving as a transfer gate turns on in response to the phase one ($\Phi$1) clock to allow the data bit D1 to arrive at the gate capacitance 18, thereby preserving the data bit D1 of the high level in the form of positive charges. When the phase one ($\Phi$1) clock appears, the gate capacitance 28 is still grounded through the field effect transistors 22 and 17 the former of which turns on in response to the phase one ($\Phi$1) clock and the latter of which remains in on-condition by the agency of the gate capacitance 19 charged as above noted, then causing the field effect transistor 24 to remain in an off-condition. The phase one ($\Phi$1) clock is simultaneously applied to the field effect transistors 13 and 23 to allow them to turn on for supplying nodes 33 and 34 with a positive high voltage level Vdd from a voltage source. When the positive voltage Vdd is supplied to the node 33, the voltage level of the node 33 is liable to go up. However, the on-resistance of the transistor 13 is selected to be sufficiently larger than that of the transistor 14, so that the node 33 remains within the low level, however a current path is established on the simultaneous on-conditions of the field effect transistors 13 and 14. On the other hand, the gate capacitance 29 do not get cancelled at this time because of the field effect transistor 24 that is in an off-condition, so that the output node 32 is still in the low level.

After accumulation of the gate capacitance 18, the phase one ($\Phi$1) clock recovers from its high level to allow the field effect transistors 12, 13, 22 and 23 to turn off, and then field effect transistors 15 and 25 turn on in response to the phase two ($\Phi$2) clock. When the field effect transistor 15 turns on, the positive chages accumulated in the gate capacitance 19 is allowed to propagate through the field effect transistors 15 and 14 to the ground, then causing the field effect transistor 17 to turn off. The field effect transistor 16 is also applied with the phase two ($\Phi$2) clock and then turns on to supply the output node 31 with the positive high level voltage Vdd, thereby shifting the output of the first stage 1 from the low level to the high level. On the other hand, even if the field effect transistor 25 turns on in response to the phase two ($\Phi$2) clock, the gate capacitance 29 is not discharged. This is because of the fact that the field effect transistor 24 remains off and, for this reason, no current path is established from the gate capacitance 29 to the ground. The gate capacitance 29 keeps the field effect transistor 27 open, so that the output node 32 remains in a low level. As a result of the shift cycle described above, the data bit D1 of the high level appears at the output node 31 and the data bit D2 of the low level is transferred from the first stage 1 to the second stage 2.

However, the conventional shift register circuit shown in FIGS. 1 to 3 has a drawback in that the current paths tend to take place between the positive voltage source Vdd and the ground, respectively. This results from the fact that the field effect transistors 13 and 14 and the field effect transistors 26 and 27 are simultaneously in an on-condition. One of the simultaneous on-conditions is described hereinbefore in connection with the transistors 13 and 14 and increases the power dissipation. Moreover, the conventional shift register circuit needs six transistors to form each stage, and, for this reason, has a complex circuit configuration.

One of the solutions proposed to reduce the power dissipation is one in which the field effect transistors 13, 16, 23 and 26 are selectively supplied with the phase one ($\Phi$1) clock and the phase two ($\Phi$2) clock instead of the positive voltage level Vdd. FIG. 4 shows the clock timings and the waveforms which appear at respective output nodes including the nodes 31 and 32 and an output node of the third stage (not shown). However, the complex circuit configuration still remains in the solution, and another problem is encountered in that the clock pulses ($\Phi$1) and ($\Phi$2) are required to drive large capacitance 18, 19, 28 and 29 and, for this reason, the clock generator (not shown) needs to have a large current driving capability, then occupying a large space.

This invention contemplates elimination of these problems inherent in the prior art or the one proposed solution.

SUMMARY OF THE INVENTION

In accordance with the present invention, there is provided a shift register circuit including a plurality of stages capable of preserving data bits entered from an external source and shifting the data bits from stage to stage, the data bits including a data bit having either first logic level or second logic level. Each of the stages is driven by a set of clock signals each alternating the logic level thereof between the first and second logic levels and consisting of a phase one clock signal, a phase two clock signal partly overlapping the phase one clock signal and a phase three clock signal partly overlapping the phase two clock signal. Each stage comprises first gate means transferring the data bit from an input node to a first node when the phase one clock signal has the first logic level, second gate means transferring the phase three clock signal of the first logic level to a second node when the data bit has the first logic level and blocking the phase three clock signal when the data bit has the second logic level, thereby transferring the data bit appearing at the first node to the second node, third gate means transferring data bit from the second node to an output node when the phase two clock signal has the first logic level for causing the output node to have either first or second logic level corresponding the other logic level of the data bit, and fourth gate means responsive to the phase three clock signal of the first logic level for supplying the output node with the second logic level when an output node of a subsequent stage preserves a data bit of the first logic level, the fourth gate means preventing the output node from the second logic level when the output node of the subsequent stage preserves the data bit of the second logic level. The shift register circuit thus arranged has the third gate means responsive to the phase two clock signal and the fourth gate means responsive to the phase three clock signal so that a current path does not take place through the third and fourth gate means for a substantial time period. This results in reduction of the power dissipation.

BRIEF DESCRIPTION OF THE DRAWINGS

The features and advantages of a shift register circuit according to the present invention will be more clearly understood from the following description taken in conjunction with the accompanying drawings in which:

FIG. 6 is a timing chart showing waveforms of signals appearing at various nodes in the shift register circuit shown in FIG. 5.

DESCRIPTION OF THE PREFERRED EMBODIMENTS

Figure 5:
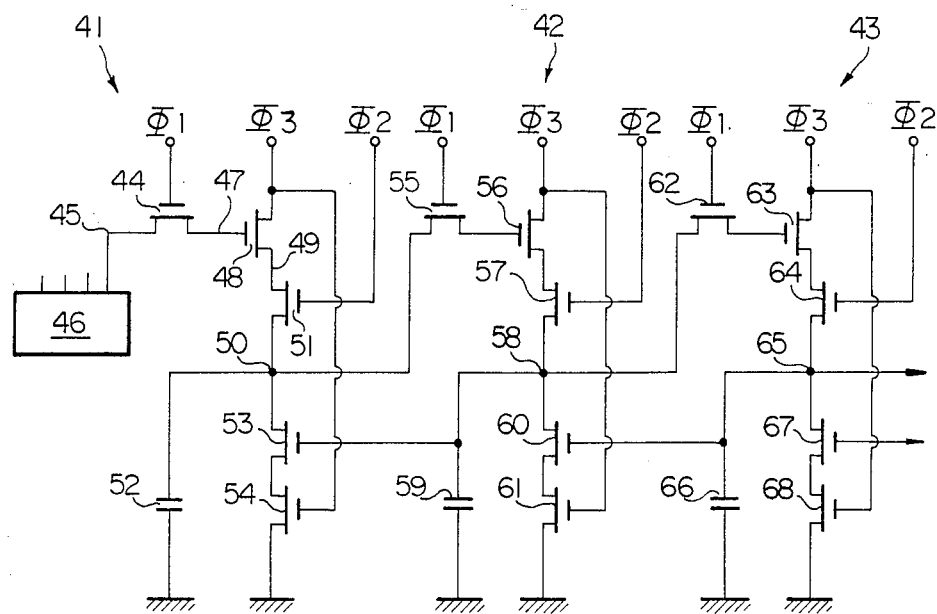
FIG. 5 is a circuit diagram showing a preferred embodiment according to the present invention.

Referring to FIG. 5 of the drawings, there is shown a part of a preferred embodiment of a shift register circuit according to the present invention. The shift register circuit embodying the present invention basically comprises a plurality of stages connected in cascade, however FIG. 5 shows first, second and third stages 41, 42 and 43, only. The first stage 41 comprises an n-channel field effect transistor 44 provided between an input node 45 connected to an external source 46 and a first node 47 and having a gate to which a phase one ($\Phi 1$) clock signal appears. The field effect transistor 44 is operative to transfer an a first data bit from the input node 45 to the first node 47 in response to the phase one ($\Phi 1$) clock signal and, for this reason, constitutes the first gate means. The first node 47 is connected to a gate of an n-channel field effect transistor 48 which is gated by the first data bit for either transferring a phase three ($\Phi 3$) clock signal to a second node 49 or blocking the phase three ($\Phi 3$) clock signal. Namely, when the first data bit has a high level, the field effect transistor 48 turns on to provide a current path capable of allowing the phase three ($\Phi 3$) clock signal to propagate. On the other hand, when the first data bit has a low level, the field effect transistor 48 remains in and off-condition, thereby blocking the phase three ($\Phi 3$) clock signal. Between the second node 49 and an output node 50 is provided an n-channel field effect transistor 51 having a gate to which a phase two ($\Phi 2$) clock signal is applicable. The field effect transistor 51 is operative to turn on to allow the phase three ($\Phi 3$) clock signal to propagate from the second node 49 to the output node 50 in the presence of the phase two ($\Phi 2$) clock signal which goes up prior to recovery of the phase one ($\Phi 1$) clock signal, therefore forming the second gate means. The output node 50 is electrically connected to an upper electrode of a capacitor 52 whose lower electrode is grounded. The capacitor 52 thus provided between the output node 50 and the ground is operative to accumulate the phase three ($\Phi 3$) clock signal indicative of the first data bit of the high level in the form of positive charges. The capacitance of the capacitor 52 is selected to be sufficiently larger than a gate capacitance of a field effect transistor 55 of the subsequent stage 42. A reason why the capacitor 52 has the large capacitance will be hereinunder described in connection with the operations of the embodiment, especially wih the second shift cycle. Between the output node 50 and the ground are further provided n-channel field effect transistors 53 and 54 which are connected in series. The field effect transistor 53 has a gate electrically connected to an upper electrode of a capacitor 59 forming part of the second stage 42 and corresponding to the capacitor 52. The field effect transistor 53 thus connected to the capacitor 59 remains in an on-condition if the capacitor 59 accumulates the phase three ($\Phi 3$) clock signal which was provided through field effect transistors 56 and 57. On the other hand, the field effect transistor 54 has a gate capable of application with the phase three ($\Phi 3$) clock signal. The field effect transistor 54 turns on in the presence of the phase three ($\Phi 3$) clock signal and remains in an off-condition in the absence of the phase three ($\Phi 3$) clock signal. Then, the combination of the field effect transistors 53 and 54 is operative to cancel the phase three ($\Phi 3$) clock signal accumulated in the capacitor 52 in response to the phase three ($\Phi 3$) clock signal if the capacitor 59 accumulates the phase three (Φ3) clock signal. Therefore, the field effect transistors 53 and 54 form in combination the fourth gate means.

The second and third stages 42 and 43 are similar in construction to the first stage 41, and, for this reason, detailed description of the second and third stages is omitted for the sake of simplicity. However, the correspondence of the components will be shown hereinunder. Namely, the field effect transistors 44, 48, 51, 53 and 54 correspond to field effect transistors 55, 56, 57, 60 and 61 in the second stage 42 and to 62, 63, 64, 67 and 68 in the third stage 43, respectively. Further, capacitances 59 and 66 are similar in function to the capacitor 52 in the first stage 41. Reference numerals 58 and 65 designate output nodes of the second and third stages 42 and 43, respectively.

Operations of the shift register circuit shown in FIG. 5 is described with reference to FIG. 6. Assuming now that all the stages 41, 42 and 43 preserve data bits D11, D12 and D13 each having the low level and that the first data bit of the high level appears at the input node 45. Prior to appearance of the first data bit, all the capacitors 52, 59 and 66 are discharged through the respective fourth gate means and, for this reason, each of the output nodes 50, 58 and 65 remain in a low level.

After the first data bit of the high level appears at the input node 45, the field effect transistor 44 turns on in response to the phase one (Φ1) clock signal at time t1 and allows the first data bit of the high level to propagate from the input node 45 to the first node 47. Prior to the recovery of the phase one (Φ1) clock signal, the phase two (Φ2) clock signal goes up to cause the field effect transistor 51 to turn on at time t2, thereby providing a current path from the second node 49 to the output node 50. The phase one (Φ1) clock signal goes down in the low level at time t3 before activation of the phase three (Φ3) clock signal, however the gate capacitance of the field effect transistor 48 keeps the field effect transistor 48 open. For this reason, the phase three (Φ3) clock signal is transferred through the current path established in the field effect transistors 48 and 51 to the output node 50 at time t4 and causes the output node 50 to go up to the high level. The phase three (Φ3) clock signal appearing at the output node 50 is accumulated in the capacitor 52 in the form of positive charges. When the phase one (Φ1) clock signal goes up to provide a current path from the capacitor 52 to the gate of the field effect transistor 56, the second data bit of the low level keeps the field effect transistor 56 close, so that the phase three (Φ3) clock signal does not appear at the output node 58 even if the field effect transistor turns on in response to the phase two (Φ2) clock signal at time t2. This results in non-charged capacitor 59 and the output node 58 of the low level. In the similar manner, the output node 65 keeps in the low level with non-charged capacitor 66. On the completion of the first shift cycle, the shift register circuit preserves new data bits, i.e., the first data bit of the high level appearing at the output node 50, the second data bit of the low level appearing at the output node 58 and the third data bit of the low level appearing at the output node 65.

When the phase one (Φ1) clock signal goes up at time t5 again, the input node 45 remains in low level so that the field effect transistor 48 remains in off-condition, and, for this reason, the phase three (Φ3) clock signal does not appear at the output node 50 on the activation of the phase two (Φ2) clock signal at time t6. On the other hand, if the field effect transistor 55 turns on in response to the phase one (Φ1) clock signal at time t5, the first data bit of the high level causes the field effect transistor 56 to turn on, thereby causing the phase three (Φ3) clock signal to appear at the output node 58 after the field effect transistor 57 turns on in response to the phase two (Φ2) clock signal at time t6. The first data bit of the high level is slightly lowered under the effect of the gate capacitance of the field effect transistor 56, however the output node 50 still remains within the high level because the capacitor 52 has a sufficiently larger capacitance than the gate capacitance as above noted. When the phase three (Φ3) clock signal arrives at the output node 58 at time t7, the capacitor 59 accumulates the phase three (Φ3) clock signal in the form of positive charges which causes the field effect transistor 53 to turn on. The field effect transistor 54 has already turned on in the presence of the phase three (Φ3) clock signal, a current path is established between the capacitor 52 and the ground, thereby discharging the phase three (Φ3) clock signal accumulated during the first shift cycle. On the completion of discharging the phase three (Φ3) clock signal, the output node 50 goes down to the low level, but the output node 58 goes up and remains in the high level by the agency of the accumulated capacitor 59.

The capacitor 59 does not accumulate the phase three (Φ3) clock signal at time t5 as described above, so that the field effect transistor 63 does not turn on even if the phase one (Φ1) clock signal goes up to the high level, then allowing the output node 65 to remain in low level. The capacitor 66 is not supplied with the phase three (Φ3) clock signal, so that the field effect transistor 60 remains on in off-condition, thereby keeping the output node 58 high. On the completion of the second shift cycle, the shift register circuit has new data bits including the data bit of the high level appearing at the output node 58, the second data bit of the low level appearing at the output node 65 and a new data bit of the low level appearing at the output node 50. Thus, the operations continues to shift the data bits in response to the clock signals.

In addition, the shift register circuit shown in FIG. 5 is formed by a plurality of n-channel field effect transistors, however a plurality of p-channel field effect transistors are available to form a shift register circuit according to the present invention. Moreover, all kinds of transistors are available to form a shift register circuit according to the present invention.

Figure 1:
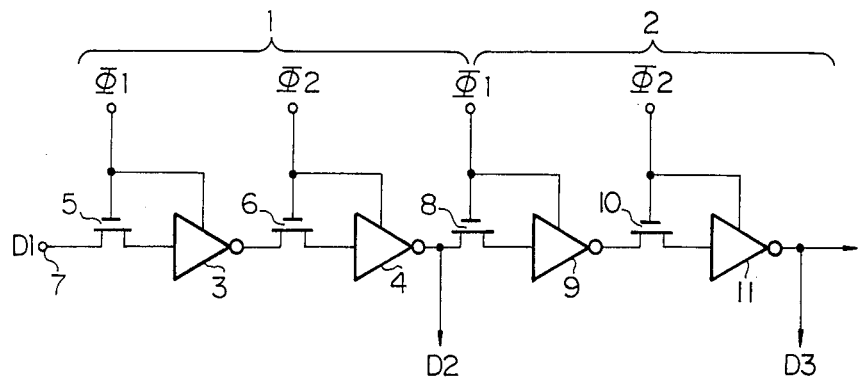
FIG. 1 is a logic diagram showing a part of a conventional shift register circuit consisting of a plurality of stages.
Figure 2:
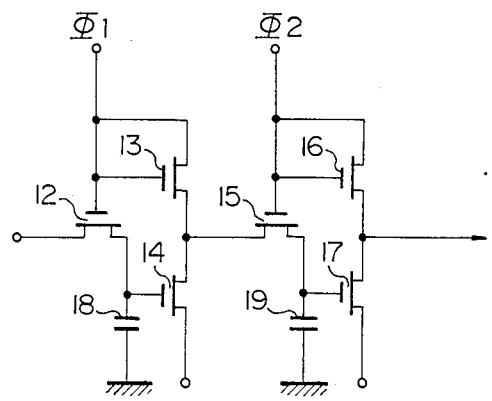
FIG. 2 is a circuit diagram showing a single stage of the shift register circuit shown in FIG. 1.
Figure 3:
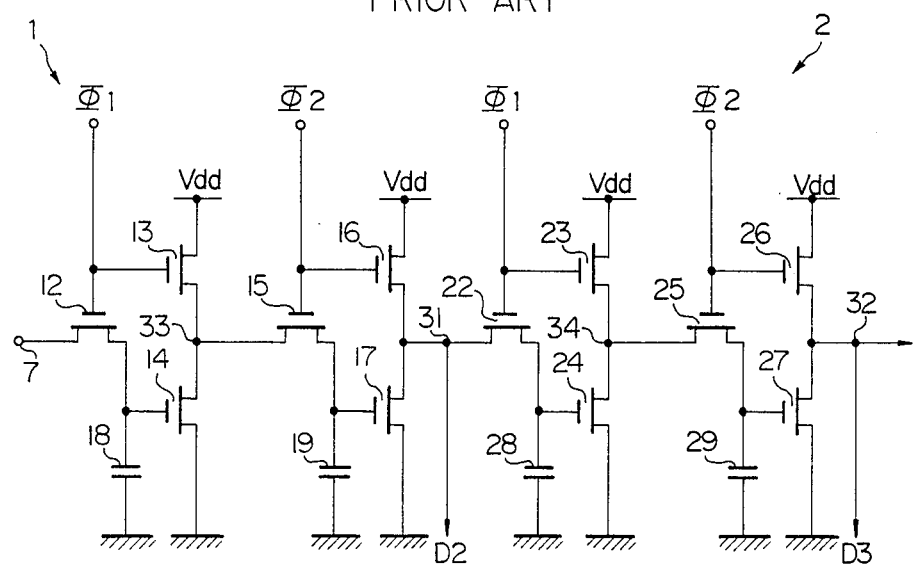
FIG. 3 is a circuit diagram showing the part of the conventional shift register circuit shown in FIG. 1.
Figure 4:
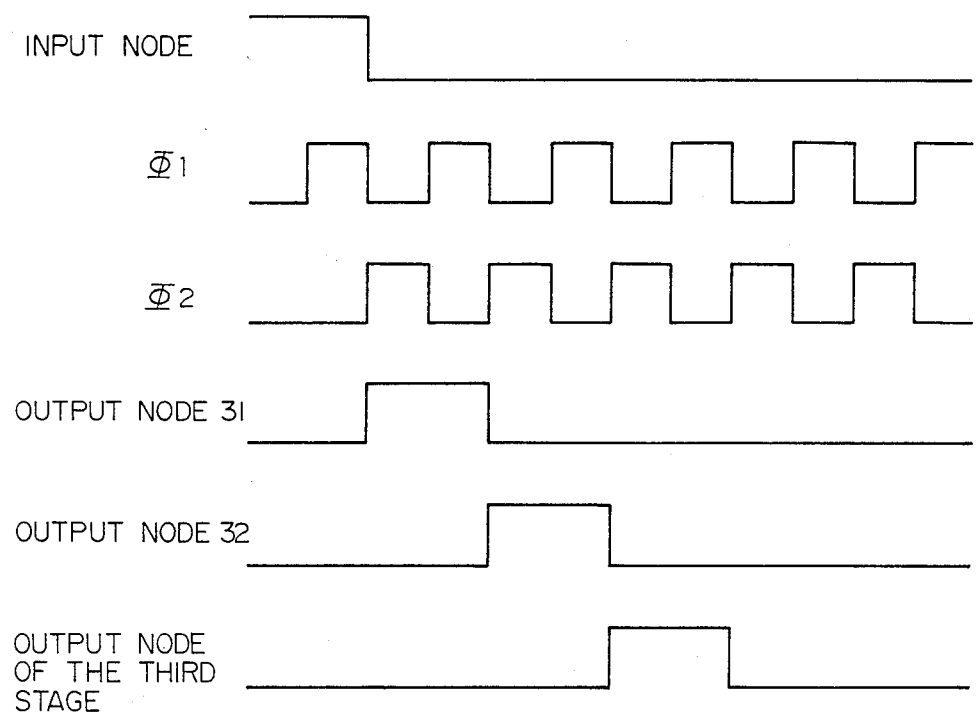
FIG. 4 is a timing chart showing modification of waveforms of signals appearing at various nodes in the shift register circuit for solution of the drawbacks inherent in the conventional circuit shown in FIG. 3.

As will be understood from the foregoing description, it is possible to realize each stage of the shift register circuit with five transistors. The phase one (Φ1) clock signal and the phase two (Φ2) clock signal are not required to drive any capacitance so that the clock generator circuit (not shown) need not have a large current driving capability. Moreover, there is no current to be discharged to the ground except for the small amount of current based on the phase three (Φ3) clock signals accumulated in the capacitors including 52, 59 and 66, so that power dissipation is drastically decreased in comparison with the shift register circuit shown in FIG. 3.

What is claimed is:

1. A shift register circuit including a plurality of stages capable of preserving data bits entered from an external source and shifting the data bits from stage to stage, the data bits including a data bit having either first logic level or second logic level, each of the stages having an input node, an output node, a first node and a second node and being driven by a set of phased clock signals, each clock signal alternating the logic level thereof between the first and second logic levels and consisting of a phase one clock signal, a phase two clock signal partly overlapping the phase one clock signal and a phase three clock signal partly overlapping the phase two clock signal and comprising:

first gate means connected between said input and first modes and responsive to said phase one clock signal for transferring the data bit from the input node to the first node when the phase one clock signal has the first logic level:

second gate means connected between said first and second modes and responsive to said phase three clock signal for transferring the phase three clock signal of the first logic level to the second node when the data bit has the first logic level and blocking the phase three clock signal when the data bit has the second logic level, thereby transferring the data bit appearing at the first node to the second node:

third gate means connected between said second and output nodes and responsive to said phase two clock signal for transferring the data bit from the second node to the output node when the phase two clock signal has the first logic level for causing the output node to have either first or second logic level corresponding to the logic level of the data bit; and fourth gate means connected between said output node and a reference potential at said second logic level and responsive to the phase three clock signal of the first logic level and a subsequent stage output node for supplying the output node with the second logic level when said output node of said subsequent stage preserves a data bit of the first logic level, said fourth gate means preventing said output node from the second logic level when the output node of the subsequent stage preserves the data bit of the second logic level.

2. A shift register circuit as set forth in claim 1, in which each of the first, second and third gate means consists of a field effect transistor.

3. A shift register circuit as set forth in claim 1, in which the fourth gate means comprises two field effect transistors connected in series and capable of providing a current path between the output node and a source of potential at the second logic level.

4. A shift register circuit comprising first to n-th (n being an integer more than two) stages connected in cascade, the i-th stage (i being an integer of one to n−1) including an input node, an output node, a first node and a second node, a first transistor having a source-drain path coupled between said input node and said first node, second and third transistors connected in series between said second node and said output node, said second transistor having a gate coupled to said first node, fourth and fifth transistors coupled in series between said output node and a reference voltage terminal, a gate of said fifth transistor being connected to said second node, a gate of said fourth transistor coupled to an output node of the (i+1)th stage, means for supplying a gate of said first transistor with a first signal, means for supplying a gate of said third transistor with a second signal, and means for supplying said second node with a third signal.

5. The shift register circuit according to claim 4, in which said first to third signals are clock signals sequentially generated with overlap therebetween.

6. The shift register circuit according to claim 4, in which the output node of each of said stages has a capacitance.

* * * * *

UNITED STATES PATENT AND TRADEMARK OFFICE
CERTIFICATE OF CORRECTION

PATENT NO. : 4,741,003
DATED : April 26, 1988
INVENTOR(S) : N. KATANOSAKA

It is certified that error appears in the above-identified patent and that said Letters Patent is hereby corrected as shown below:

COLUMN 2, LINE 20, Delete "chages" and insert --changes--;

Line 54, Delete "configulation" and insert --configuration--;

COLUMN 4, Line 15, Delete "an";

COLUMN 5, LINE 35, Delete "in" and insert --to--.

COLUMN 8, Line 31, After "third" insert --clock--, after "are" delete "clock signals".

Signed and Sealed this

First Day of November, 1988

Attest:

DONALD J. QUIGG

Attesting Officer

Commissioner of Patents and Trademarks